United States Patent [19]

Kasprzyk

[11] Patent Number: 4,897,051

[45] Date of Patent: Jan. 30, 1990

[54] FLEXIBLE ELECTRIC COMPONENT LEADS

[75] Inventor: Donald J. Kasprzyk, Maple Grove, Minn.

[73] Assignee: Honeywell Inc., Minneapolis, Minn.

[21] Appl. No.: 167,050

[22] Filed: Mar. 11, 1988

[51] Int. Cl.⁴ .......................................... H01R 13/70
[52] U.S. Cl. ...................................... 439/620; 439/32
[58] Field of Search .................... 439/32, 33, 493–499, 439/620

[56] References Cited

U.S. PATENT DOCUMENTS

| | | | |
|---|---|---|---|
| 3,171,921 | 3/1965 | Woods | 200/116 |
| 3,258,563 | 6/1966 | Landau | 200/116 |
| 3,268,689 | 8/1966 | Powell | 200/116 |
| 4,184,730 | 1/1980 | Huebner | 439/84 X |
| 4,351,582 | 9/1982 | Emerson et al. | 439/499 X |
| 4,560,226 | 12/1985 | Dennis | 439/493 X |

Primary Examiner—Eugene F. Desmond
Attorney, Agent, or Firm—Kinney & Lange

[57] ABSTRACT

A flexible electrical connection for use in mounting electrical components to provide three dimensional flexiblity without allowing short circuiting or adverse temperature response which comprises thin and flat conductor leads shaped and bent to form relatively long flat extension portions which are bendable and twistable to permit flexibility in each of the desired directions.

20 Claims, 1 Drawing Sheet

FLEXIBLE ELECTRIC COMPONENT LEADS

BACKGROUND OF THE INVENTION

1. Field of the Invention

The present invention relates to the mounting of electrical components with flexible leads and, more particularly, with leads that are shaped so that a device mounted thereon is movable in each of three mutually orthogonal directions and is relatively inflexible in other directions.

2. Description of the Prior Art

In some situations, the mounting of electrical components must be accomplished with a certain degree of flexibility so that the component is enabled to move under the action of various forces such as the normal operating motion of a member to which the component may be attached. Such motion should be allowed in at least as many directions as the member moves and preferably in three orthogonal directions. Furthermore, it is desirable that the component motion be accomplished without putting undue stress on the movable component or that the component not be permanently displaced. At the same time, it is desirable to have the conductors be relatively rigid so that they do no move about and cause shorting or grounding or cause repeated stress on the electrical connections which might produce an open circuit. The prior art has heretofore generally utilized shielded or bare wires such as are disclosed in the H. W. Landau U.S. Pat. No. 3,258,563 issued June 28, 1966, and assigned to the assignee of the present invention. In this invention, a delicate switch is employed which is capable of locking in a closed position until such time as a bimetal member, heated by a resistor through which current flows, causes the tripping of the switch to an open position. The electrical leads going to and from the resistor associated with the bimetal member have, in the past, been shielded wire of a common variety, or in some cases bare flexible lead wire. Insulated lead wire may become stiff at low temperatures which can produce stress on the bimetal member and cause the safety switch to produce errors. If the conductors are bare, they can short circuit or ground out. In the circuit breaker art such as shown in the W. N. Woods U.S. Pat. No. 3,171,921 and O. B. Powell U.S. Pat. No. 3,268,689, multistrand braided wire is used for electrical connections in a circuit heater. When multiple stranded leads are used, the same problems as above exist and there are additional difficulties in trying to attach the leads to a standard printed circuit board.

SUMMARY OF THE INVENTION

The present invention overcomes the problems in the prior art by utilizing a relatively long flat conductor bent into such a shape that there are extended portions which allow bending and/or twisting in each of three orthogonal directions. Since a flat conductor of length greater than width and width greater than thickness can twist along its length and can bend in cantilever fashion in a direction perpendicular to its thickness with a little springiness and is rather unbendable in any other direction, the forming of the conductor in proper shape allows flexibility in the desired directions and yet substantially rigidity in others. This allows desired motion and yet prevents unnecessary movement and possible shorting of the conductors within a housing. Since the conductor is unshielded, there is no excessive stiffening and a wide range of temperatures can be accommodated. Furthermore, the component tends to remain in its initial position, and the conductors themselves can be shaped to fit within most housing shapes. Furthermore, the ends of the conductors can be shaped to easily attach to printed circuit board terminals thus avoiding additional solder connections.

DETAILED DESCRIPTION OF THE PREFERRED EMBODIMENTS

Figure 1:
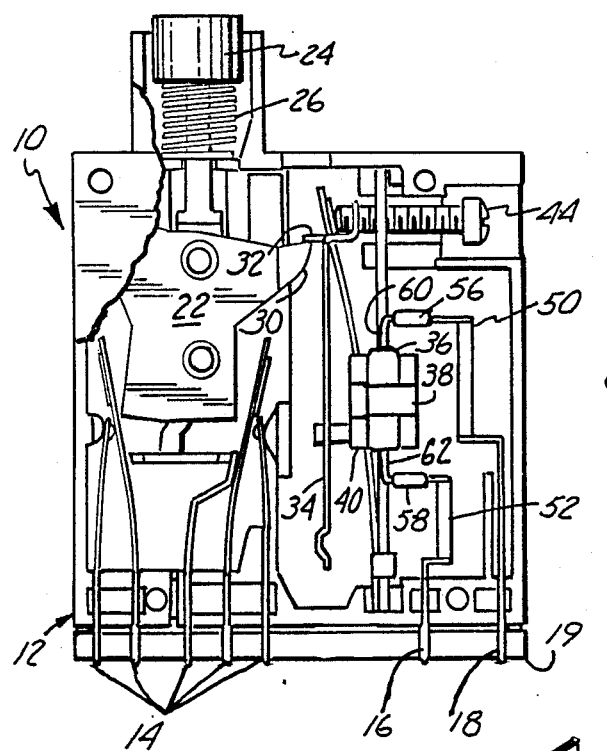
FIG. 1 is a cross-sectional view of a trip-free safety switch in which the present invention is employed.

In FIG. 1, a trip-free safety switch of the general type shown in the above mentioned U.S. Pat. No. 3,258,563 is shown comprising a housing 10 broken away to show the interior of the switch. Housing 10 has a base portion 12 through which a plurality of contact terminals such as 14, 16 and 18 project. All of the terminals are suitably shaped for connection to a printed circuit board 19 and may be wave soldered thereto from the opposite side.

Terminals 14 are connected to switch arms within the housing movable to open and closed positions by the up and down motion of a rocker member 22 actuable to a downward position by a manually operated push button 24 biased upwardly by a spring 26. A laterally extending catch arm 30 of member 22 is shown with its tip hooked up under a laterally extending catch 32 of a bimetalic member 34. Bimetalic member 34 is fastened to the housing 10 but is capable of motion to the right and left in FIG. 1 in accordance with the temperature produced by an electrical heater or resistor 36 fastened by a strap 38 to a heat conducting member 40 attached in heat conducting relationship to the bimetallic member 34. As the heater 36 generates heat by virtue of the current passing therethrough, this heat will be transferred by the heat conductive member 40 to the bimetal member 34 and will cause it to move in an arc to the right in FIG. 1 thereby releasing the lateral extension 30 from the catch extension 32. The exact position where the catch 32 and extension 30 separate is set by a screw 44 mounted in housing 10.

When the extension 30 is disengaged from the catch 32, bias spring 26 will force member 22 to an upward position and thereby open and/or close the switch contacts to which terminals 14 are connected in a desired fashion. Upon cooling, the bimetal member 34 will move to the left so that with subsequent downward motion of push button 24 and rocker member 22, tip 30 may again engage extension 32. The operation of the switch contacts and the member 22 are not a part of the present invention and need not be further described.

It is desirable that resistor heater 36 be electrically connected to terminals 16 and 18 in such a manner that the resistor 36 and heat conductor 40 are movable at least in the directions required by the motion of bimetal member 34 and preferably in three orthogonal directions. More particularly, it is desired that resistor 36 and heat conductor 40 at least move to the right and left, and up and down, in FIG. 1, and preferably also into and out of the plane of the drawing to compensate for manufacturing and assembly tolerances. Accordingly, the present invention utilizes a pair of elongated flat conductors 50 and 52 which, at one end thereof, form the contact terminals 16 and 18 and, at the other end, form to electrically contact resistor terminals 56 and 58 formed on the ends of lead wires 60 and 62 of resistor 36. The structure of conductors 50 and 52 is better shown in FIG. 2 in which elongated flat conductive members 50 and 52 are bent in a shape which is convenient for fitting within the housing 10 but with three relatively long extensions between the ends so that the members may bend there in a direction perpendicular to their thicknesses or twist along their apex, thus permitting the desired flexibility in three directions.

Figure 2:
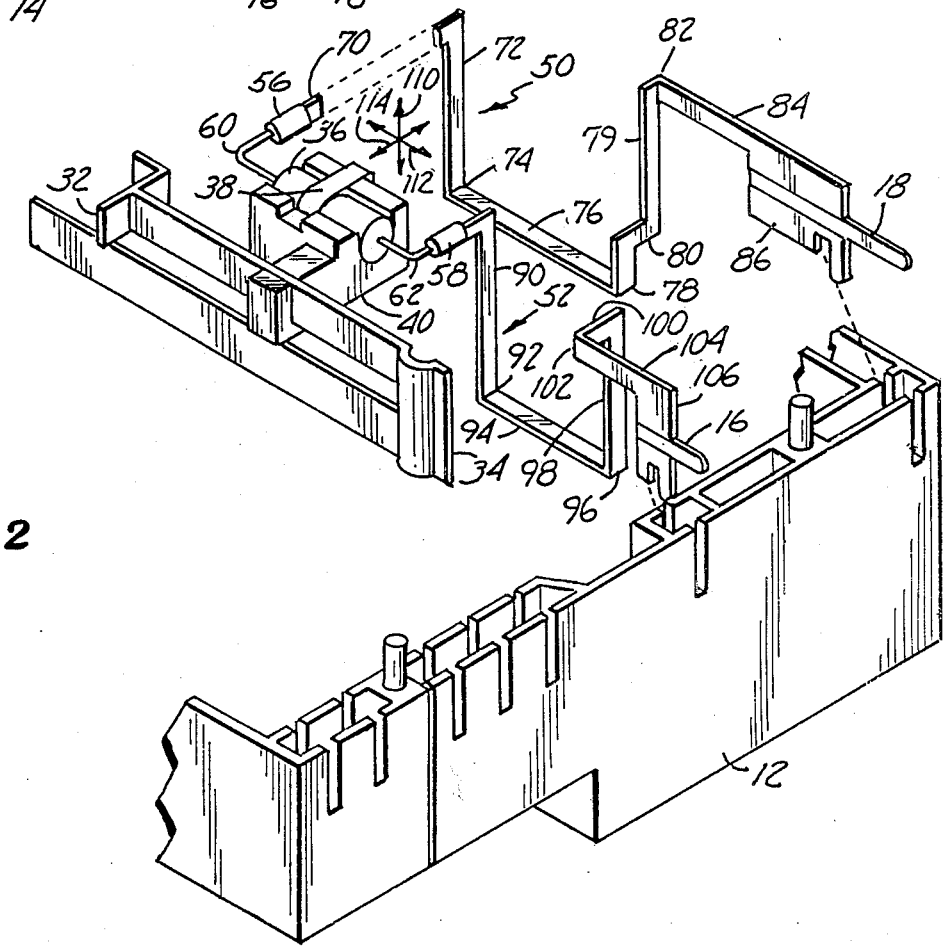
FIG. 2 is an enlarged perspective view of a portion of the housing in FIG. 1 and the heater leads used in connection therewith.

In FIG. 2, it is seen that member 50 has a first extension 70 which is shown in broken relationship for drawing clarity but which is actually relatively short and which is connected to resistor 36 at the remote end thereof. Extension 70 then bends downwardly along a relatively long and flat extension portion 72 at the end of which a right angle bend 74 leads to a third relatively long flat extension portion 76 which is generally parallel to the axis of resistor 36. At the end of extension 76, a second right angle bend 78 produces another relatively long flat extension portion 79 which has a little jog 80 therein for purposes of conforming to the interior of the housing 10. At the upper end of extension 79 a right angle bend at corner 82 leads to a relatively short flat extension portion 84 which ends in a flat, plate-shaped portion 86 into which the desired terminal structure 18 is formed for purposes of attachment to an printed circuit board. Similarly, conductive member 52 is connected at terminal 58 to the near end of resistor 36. Member 52 has a relatively long and downwardly extending portion 90 which, at a right angle bend 92, leads to a second relatively long extension portion 94 which is generally parallel to the axis of resistor 36. A second right angle bend 96 leads to a third relatively long flat extension portion 98 which extends upwardly and then moves through a jog 100 to accommodate the housing shape to a third right angle bend 102 which leads to a relatively short, flat extension portion 104. Extension 104 terminates in a plate-shaped portion 106 into which the desired terminal structure 16 is formed for purposes of attachment to the integrated circuit chip.

The shape of the two flexible leads 50 and 52 permits three degrees of freedom of motion of resistor 36 along axes shown in FIG. 2 as a vertical axis 110, a horizontal axis 112 and a lateral axis 114. Flexing in a direction indicated by arrow 110 is produced by bending action in the relatively long flat sections 72, 76 and 79 of flexible lead 50 and in the relatively long flat sections 90, 94 and 98 of flexible lead 52. Flexing in a direction indicated by arrow 112 is produced by bending action in the relatively long and flat sections 72, 76 and 78 of flexible member 50, and in the relatively long flat extensions 90, 94 and 98 of flexible member 52. Flexing in a direction indicated by arrow 114 is produced by twisting action in the relatively long flat extensions 72 and 79, and in relatively long flat extension 90 and 98. It should be noted that the extensions 84 and 104 are relatively short and do not significantly add to the flexibility of the design.

It is seen that members 50 and 52 terminate in a relatively flat portions 86 and 106, respectively, which are formed so as to be able to fit within the grooves of the base member 12 of housing 10 and to terminate in the desired terminal structures 16 and 18 for purposes of attachment to an printed circuit board.

Flexible lead 50 and 52 are so shaped as to allow the desired motion in each of the three orthogonal directions but which are relatively rigid in the other directions to thus allow three-dimensional flexibility and more particularly, to allow free motion of the bimetal member 34 without undue stress. The composition of the members 50 and 52 may be any desired suitable conductive material, but in the preferred embodiment are phose bronze which is approximately 0.004 inches thick and approximately 0.040 inches wide and with length necessary to reach from terminals 16 and 18, respectively, to resistor 36 while conforming to the space available in housing 10. The flexible leads provide a structure which cannot short out and which does not significantly change flexibility at any ambient temperature likely to be encountered. The resistor 36 returns naturally to the original position without undue stress on the bimetal member 34 or on either of the two flexible conductors. Since the cross section of the conductors is small compared to the wires, heat is not lost through the conductors. The cost of the heater leads is quite minimal and cost is further reduced by the ease of assembly.

Although the preferred invention has been described with reference to preferred embodiments, workers skilled in the art will recognize that changes may be made in form and detail without departing from the spirit and scope of the invention.

What is claimed is:

1. Apparatus for mounting an electrical member in a housing so that it may be electrically connected to circuit means external to the housing and mechanically connected to the housing so as to be flexible generally along first, second and third axes, the electrical member having a first terminal comprising:

first electrical conductive compound spring means having first and second ends with first, second and third relatively thin flat portions therebetween, the first, second and third flat portions being bendable and twistable so as to permit flexibility generally along the first, second and third axes; and connection means connecting the first end of the first spring means to the first terminal of the electrical member and connecting the second end of the fist spring means to the housing so as to extend from the interior to the exterior of the housing for connection to the circuit means.

2. Apparatus according to claim 1 wherein the first spring means comprises an elongated flat metallic member having a first bend between the first and second flat portions and a second bend between the second and third flat portions.

3. Apparatus according to claim 2 wherein the first and second bends are substantially 90°.

4. Apparatus according to claim 1 wherein the apparatus includes an electrical member which is a heater thermally connected to a heat responsive member that may move in at least one of the first, second and third directions.

5. Apparatus according to claim 4 wherein the heat responsive member is a bimetallic device.

6. Apparatus according to claim 5 wherein the flat portions have a width and a thickness and the width is substantially ten times the thickness.

7. Apparatus according to claim 6 wherein the metallic member is phosphor bronze.

8. Apparatus according to claim 7 wherein the width is approximately 0.040 inches and the thickness is approximately 0.004 inches.

9. Apparatus according to claim 1 wherein the second end of the first spring means is formed in a shape suitable for connection to a printed circuit board.

10. Apparatus according to claim 1 wherein the electrical member has a second terminal and further including second electrically conductive compound spring means having first and second electrical terminals with first, second and third relatively thin flat portions therebetween, the first, second and third flat portions being bendable and twistable so as to permit flexibility generally along the first, second and third axes and the connection means also connects the first terminal of the second spring means to the second terminal of the electrical member and the second terminal of the second spring means to the housing so as to extend from the interior to the exterior of the housing for connection to the circuit means.

11. Apparatus according to claim 10 wherein the first and second spring means each comprises an elongated flat metallic member having a first bend between the first and second flat portions and a second bend between the second and third flat portions.

12. Apparatus according to claim 11 wherein the first and second bends are substantially 90°.

13. Apparatus according to claim 12 wherein the apparatus includes an electrical member which is a heater thermally connected to a heat responsive member.

14. Apparatus according to claim 13 wherein the heat responsive member is a bimetallic device which moves with changes in temperature and the heater is mechanically connected thereto by a heat conductive member and is operable to change the temperature to cause motion of the bimetallic device.

15. Apparatus according to claim 1 wherein the second ends of each spring means are shaped to be connectable to a printed circuit board by wave soldering.

16. Apparatus according to claim 15 wherein the housing includes first and second slots extending from an internal to an external portion thereof and the second ends of each spring means are further shaped to fit in the first and second slots respectively with the second ends of the spring means also extending externally of the housing for insertion into the printed circuit board.

17. Electrically conductive mounting apparatus to mount an electrical component in a housing, the component having first and second terminals, and the mounting apparatus operable to permit flexible motion of the component generally along first, second and third axes comprising:

first and second compound spring means each comprised of an electrically conductive member having first and second terminals and having a length, a width which is less than the length, and a thickness which is less than the width, the spring means being flexibly bendable and twistable, the spring means having at least three legs, the first leg extending generally in a first direction with the thickness substantially perpendicular to the first of the axes, the second leg extending generally in a second direction with the thickness substantially perpendicular to the second of the axes and the third leg extending generally parallel to the first leg; and connection means connecting the first terminal of the first spring means to the first terminal of the component, the first terminal of the second spring means to the second terminal of the component and the second terminals of the first and second spring means to the housing so as to extend to the exterior thereof for connection to an external circuit.

18. Apparatus according to claim 17 wherein the second terminals of the first and second compound spring means are formed in a shape suitable for connection to a printed circuit board.

19. Apparatus according to claim 17 wherein the first and second spring means each includes a first bend between the first and second legs and a second bend between the second and third legs.

20. Apparatus according to claim 19 wherein the first, second and third axes are substantially mutually perpendicular and the first and second bends form substantially right angles.

* * * * *

UNITED STATES PATENT AND TRADEMARK OFFICE
CERTIFICATE OF CORRECTION

PATENT NO. : 4,897,051

DATED : January 30, 1990

INVENTOR(S) : Donald J. Kasprzyk

It is certified that error appears in the above-identified patent and that said Letters Patent is hereby corrected as shown below:

Column 4, line 43, delete "fist" and insert --first--.

Signed and Sealed this

Eighth Day of January, 1991

*Attest:*

HARRY F. MANBECK, JR.

*Attesting Officer*  *Commissioner of Patents and Trademarks*